United States Patent
Sakuma et al.

(10) Patent No.: US 7,514,290 B1
(45) Date of Patent: Apr. 7, 2009

(54) CHIP-TO-WAFER INTEGRATION TECHNOLOGY FOR THREE-DIMENSIONAL CHIP STACKING

(75) Inventors: Katsuyuki Sakuma, Kanagawa (JP); Paul Stephen Andry, Yorktown Heights, NY (US); Kuniaki Sueoka, Kanagawa-ken (JP); John Ulrich Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/108,512

(22) Filed: Apr. 24, 2008

(51) Int. Cl.
*H01L 21/00* (2006.01)

(52) U.S. Cl. .......... 438/108; 438/74; 438/109; 438/244; 438/FOR. 368; 257/E27.137; 257/686; 257/777; 437/208

(58) Field of Classification Search ....... 438/FOR. 368, 438/FOR. 426, 108, 109, 74, 244, 253, 387, 438/396; 257/E27.137, E27.144, E27.161, 257/678, 777, 685, 686; 361/760; 437/208, 437/915
See application file for complete search history.

(56) References Cited

U.S. PATENT DOCUMENTS

| | | | | |
|---|---|---|---|---|
| 4,997,791 | A * | 3/1991 | Ohuchi et al. | 437/209 |
| 5,048,179 | A * | 9/1991 | Shindo et al. | 29/840 |
| 5,998,859 | A * | 12/1999 | Griswold et al. | 257/679 |
| 6,117,704 | A | 9/2000 | Yamaguchi et al. | |
| 6,555,906 | B2 * | 4/2003 | Towle et al. | 257/723 |
| 6,713,859 | B1 * | 3/2004 | Ma | 257/687 |
| 6,919,223 | B2 * | 7/2005 | Osada | 438/106 |
| 7,335,974 | B2 | 2/2008 | Hwang et al. | |
| 2006/0228832 | A1 | 10/2006 | Koh | |
| 2006/0273444 | A1 | 12/2006 | Jung et al. | |
| 2007/0007641 | A1 | 1/2007 | Lee et al. | |
| 2007/0013058 | A1 | 1/2007 | Choi et al. | |

* cited by examiner

*Primary Examiner*—Chris C. Chu
(74) *Attorney, Agent, or Firm*—Maxvalueip, LLC

(57) ABSTRACT

This embodiment addresses a novel Chip-to-wafer chip lamination technique that provides low cost and high throughput. In the Chip-to-Chip process, using the temperature rise and utilizing deformation caused by thermal expansion of a metal shim inserted between the inner wall of a cavity, in which multiple chips are laminated and accommodated, multiple chips in the cavity are pressed against a reference surface on a side wall of the cavity to automatically perform positioning.

1 Claim, 4 Drawing Sheets

CHIP-TO-WAFER INTEGRATION TECHNOLOGY FOR THREE-DIMENSIONAL CHIP STACKING

BACKGROUND OF THE INVENTION

Semiconductor devices have realized improvements in performance such as high speed, sophisticated functions, low power dissipation, and low cost by continuing remarkable miniaturization and high integration according to Moore's Law. However, with further miniaturization such as 90 nm and 65 nm, because of financial problems such as the increase of capital investment and research and development costs, and technical problems such as increase of idle current of transistors, promotion of miniaturization according to conventional development speed has become difficult. Against these problems, development of a lamination System-in-Package (SiP), which three-dimensionally combines multiple LSIs, is considered to be a promising solution. This is because the lamination SiP is a high-density packaging and thus can be a means of realizing a function exceeding System-On-Chip (SoC) by optimal system design. There are three methods for the 3D lamination structure process: Chip-to-Chip process, Chip-to-Wafer process, and Wafer-to-Wafer process.

SUMMARY OF THE INVENTION

When joining chips, the chip surface and substrate are heated up to the vicinity of the melting point of a bonding metal. In the Chip-to-Chip process, using the temperature rise and utilizing deformation caused by thermal expansion of a metal shim inserted between the inner wall of a cavity, in which multiple chips are laminated and accommodated, multiple chips (assumed being of the same size) in the cavity are pressed against a reference surface on a side wall of the cavity to automatically perform positioning.

DETAILED DESCRIPTION OF THE PREFERRED EMBODIMENTS

Conventional Chip-to-Wafer bonding is conducted using the flip chip implementation method. The flip chip implementation method is a method of conducting heat and press-fitting after aligning an array of projection type terminals called bumps with pads on the substrate when electrically connecting each chip and the substrate. Therefore, when laminating multiple chips, it is necessary to repeat the positioning, heating and press-fitting process as many times as the number of chips to be laminated. Moreover, when preparing laminated chips in an array fashion on a wafer, the process has to be repeated as many times as the number of laminated chips arranged in an array fashion. Accordingly, it takes time for the conventional method in the positioning and heating and press-fitting process, so that there is a problem in that throughput in the manufacturing is lowered.

Figure 1:
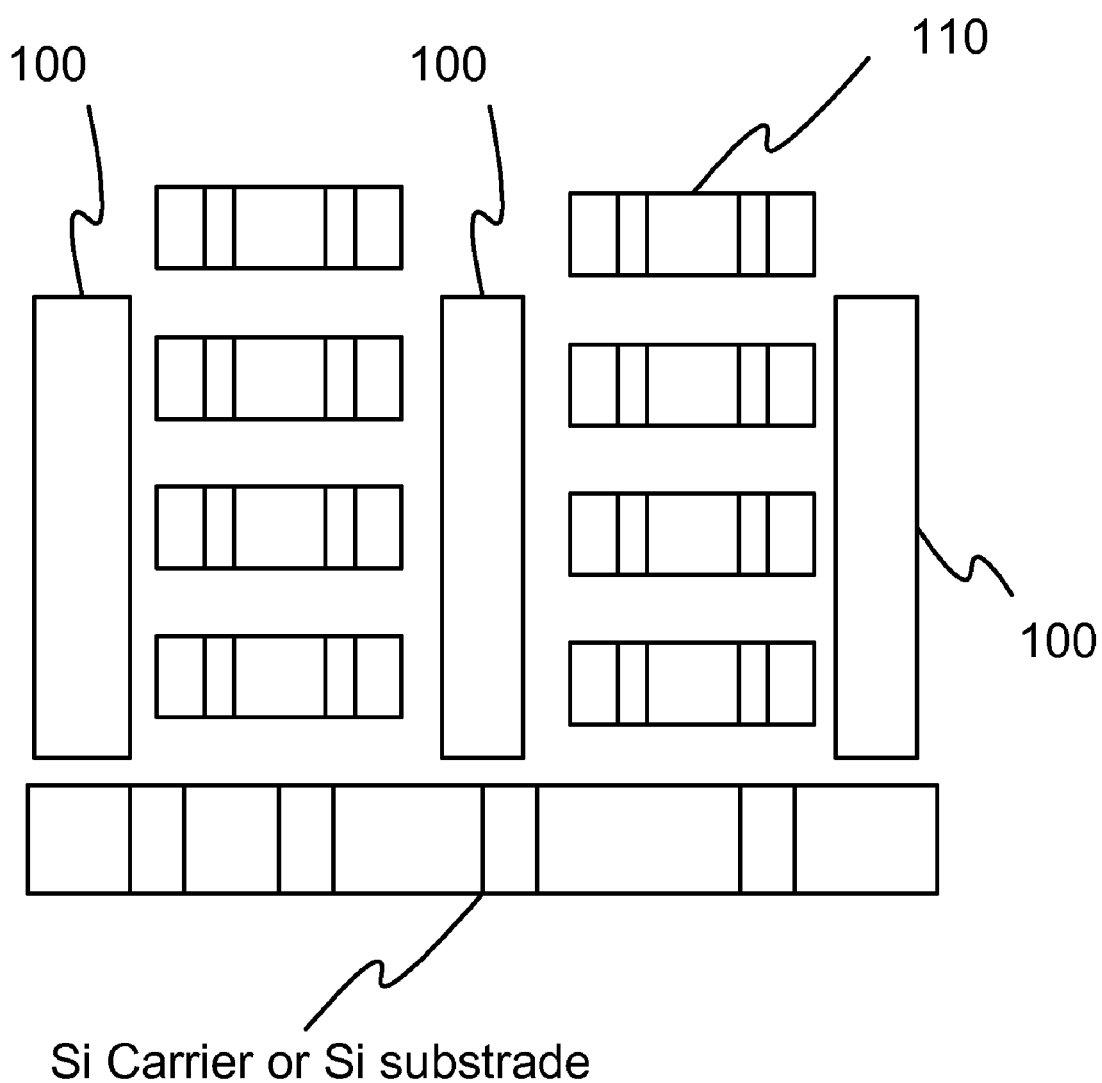
FIG. 1 is a diagram of Chip to Wafer technique using chip cavity method (assembly of chips)
Figure 2:
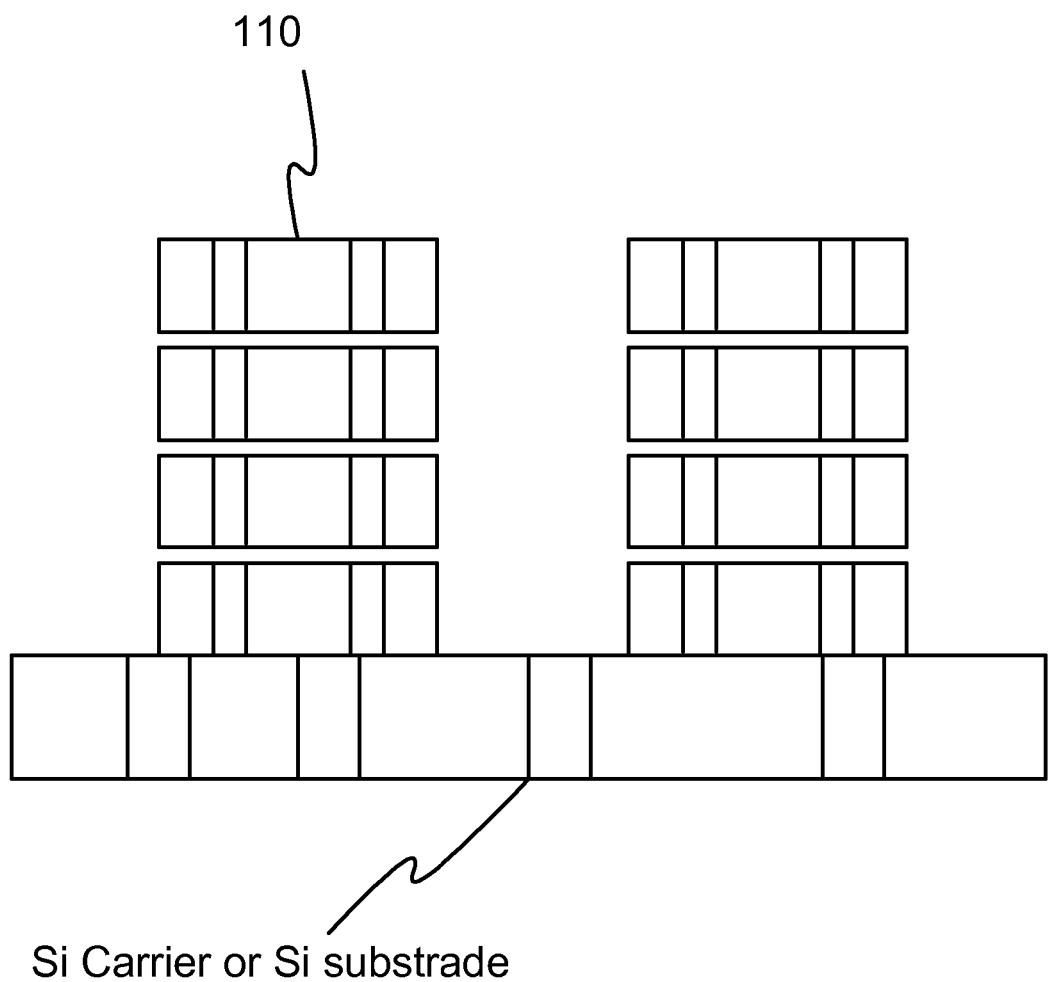
FIG. 2 is a diagram of Chip to Wafer technique using chip cavity method (remove chip cavity after molding)
Figure 3:
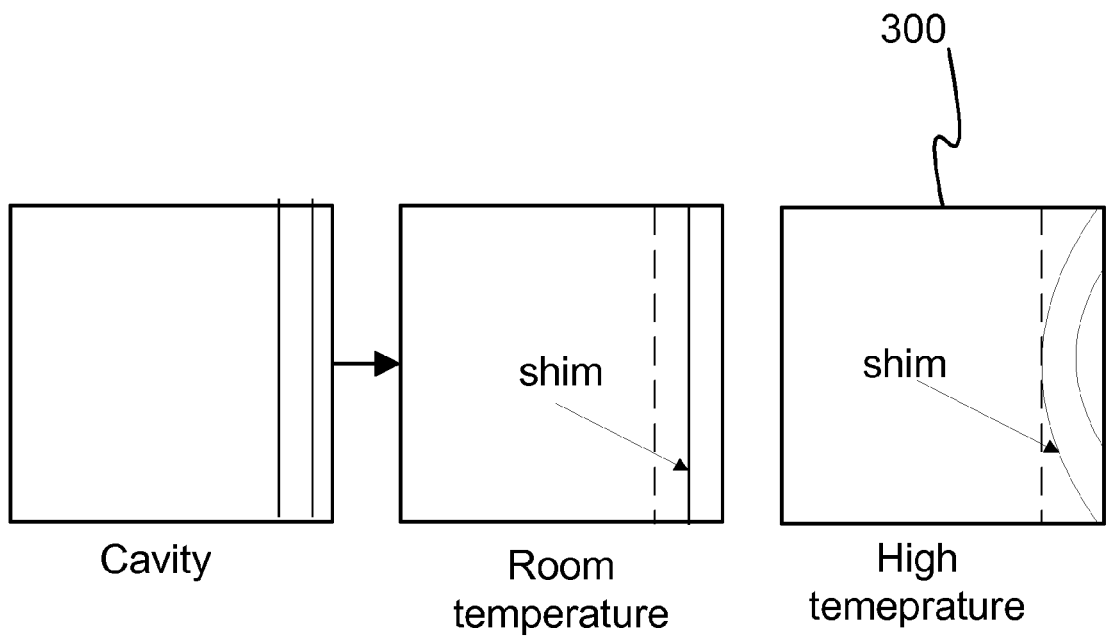
FIG. 3 depicts the positioning method utilizing shim molybdenum chip cavity
Figure 4:
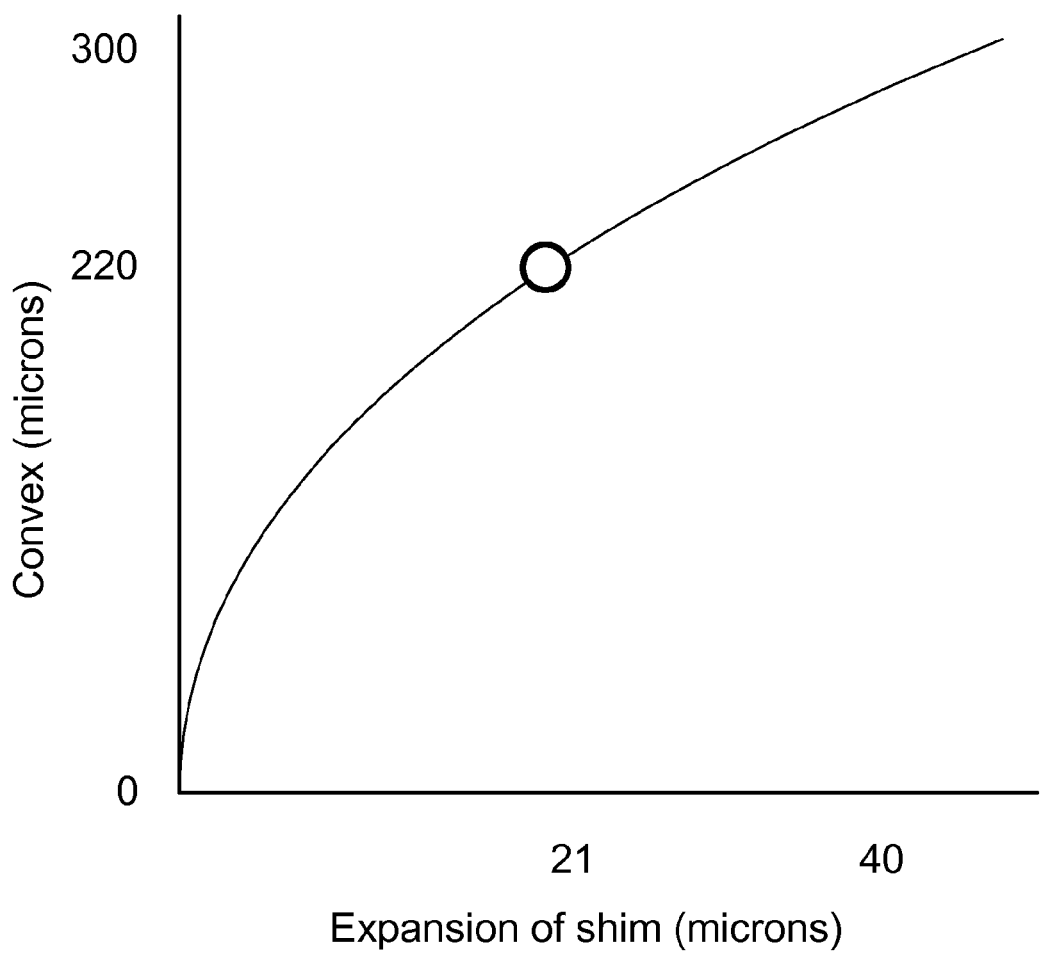
FIG. 4 depicts the deformation of phosphor bronze shim

In the present embodiment, we have a chip-to-wafer chip lamination technique that provides low cost and high throughput, and a high precision automatic positioning technique. FIG. 1 shows a chip cavity (100) used for the new Chip-to-wafer chip lamination technique. The cavity is a hole to accommodate a chip (110) and can be used as a positioning reference when laminating chips. At the time of heating and press-fitting when joining, it plays the role of keeping the chip from moving. When laminating chips using the cavity, after accommodating as many chips to be laminated in the cavity, heating and press-fitting are conducted and laminated chips can be manufactured at once depicted by FIG. 2. Further, using a side surface of the cavity as a reference surface for positioning, no process is required for positioning upper and lower chips layer by layer, so that multiple chips can be simultaneously laminated. When producing laminated chips in an array fashion on the wafer, it is possible to collectively conduct the process by preparing cavities arranged in an array fashion. Therefore, since throughput of the manufacturing is greatly enhanced and no device mechanism is necessary to provide positioning, a three-dimensional lamination chip can be manufactured at low cost. When high precision is required for positioning upper and lower chips, in the gap of the chips accommodated in an inner wall of the hole of the cavity and inside of the hole, a shim of material having a larger CTE (Coefficient of Thermal Expansion) than the cavity material is prepared. Utilizing stress at the time of deformation by thermal expansion (300), by pressing the chip in a cavity against one corner of the cavity, it becomes possible to automatically perform positioning in units of micrometers. The schematic diagram is shown in FIG. 3. As for cavity material, in addition to metal such as molybdenum, tungsten etc, whose CTE is relatively close to that of silicon, glass, or ceramics, it is possible to process and manufacture the same silicon as the chip to be laminated. Here, using a cavity (e.g. the size of the hole being 7.15 mm×6.15 mm, but the principal works for nm to m range) made of molybdenum and shim made of phosphor bronze, a preliminary experiment of positioning is conducted. FIG. 4 shows the deformation amount of phosphor bronze obtained by calculation.

Deformation of the shim is approximated by an arc and the bulge by thermal expansion is calculated. For example, when the size of the cavity is as above, it is found that lateral displacement of about ten times of thermal deformation in the longitudinal direction of the shim is obtained by adopting such a configuration. The CTE property of phosphor bronze and molybdenum used here is assumed as follows: Phosphor bronze (CTE: 18 ppm/T), Molybdenum (CTE: 5 ppm/T) (with CTE typically ±50-100 percent, in a range, higher and lower) (typical measurements at 20 C).

By using the Chip-to-wafer chip lamination technique utilizing a cavity, low cost and high throughput chip lamination becomes possible. If the number of chips to be laminated is n and the number of lamination chips arranged in an array fashion on a wafer is m, it is possible to reduce the number of process 1/(m×n) times than the conventional method. (For example, if it is assumed that eight layers of memory and sixteen lamination memories are assumed to be arranged on a wafer, it is possible for the lamination method using the cavity to reduce processing time 1/128 times than the conventional method.) Moreover, using the shim, a high precision positioning in units of micrometers becomes possible.

Some other embodiments of the present invention are listed below:

for any method to push the thinned die against two sides which can provide vertical alignment of the die in the stack including those in disclosure and additional concepts that could be compliant and not cause damage to thinned edge of silicon. Examples can be Use of spring, CTE of material such as polymer material or metal, spring, encapsulated liquid, etc so long as the force to align chips can align die and also not damage the die.

Alternative for slider structure where each of two sides of die are aligned by use of cavity and sliding mechanism to align all die against two adjacent sides of a die.

Add Vertical force to provide flattening of one or more die in a die stack and enhance contact between die for high yield of interconnection joints in addition to horizontal force for chip alignment. Important as die are thinned and may have residual stress that causes the thinned die or die stacks to bow or be non planar unless a compensating force causes this die or die stacks to be held planar.

Use of one or more molds to hold different size die or die stacks. For example could be larger die in mold and adjoining mold holds one or more die mounted on the surface in proper position. For example one large die and then another mold holds all the smaller die directly positioned over large die or silicon carrier. Alternatively can be one larger die, silicon package or wafer with multiple die accurately stacked on the surface one or more high.

An embodiment of the invention is a system for chip-to-wafer integration technology for three-dimensional chip stacking, the system is comprised of:

One or more chips, a substrate, an array of one or more cavities and one or more shims. The array of one or more cavities is prepared over the substrate. Moreover, the array of one or more cavities is made of a cavity material and the one or more shims are made of a shim material.

The shim material has a larger coefficient of thermal expansion than that of the cavity material. The cavity material is molybdenum, tungsten, glass, ceramic, or silicon and the shim material is metal, polymer, phosphor bronze, or liquid.

The one or more chips are stacked on top of each other over the substrate in each of the array of one or more cavities. Dimensions of each of the array of one or more cavities are slightly larger than dimensions of the stacked chips. The stacked chips are pushed against one or more walls of each of the array of one or more cavities. The one or more shims are prepared in the gaps between the stacked chips and inner walls of each of the array of one or more cavities.

Pressure is applied vertically to the stacked chips over the substrate. Lamination is done by heating up the one or more chips, the one or more shims, the array of one or more cavities, and the substrate, at once to a temperature that bonds the one or more chips to each other and to the substrate. The one or more shims are expanded and deformed at the temperature. The deformed one or more shims push and align the one or more chips to the inner walls of the array of one or more cavities.

One or more molds are used to hold the one or more chips, wherein the one or more chips in the stacked chips have different sizes and the array of one or more cavities are removed after the lamination.

A method, apparatus, or device comprising one of the following items is an example of the invention: chip, wafer, integration, processing facility, shim, walls, stacked layers, cavities, applying the system mentioned above, for purpose of semiconductor processing.

Any variations of the above teaching are also intended to be covered by this patent application.

The invention claimed is:

1. A method for chip-to-wafer integration technology for three-dimensional chip stacking, said method comprising:
   providing one or more chips;
   providing a substrate;
   providing one or more shims;
   preparing array of one or more cavities over said substrate;
   wherein walls of said array of one or more cavities is made of a cavity material;
   said one or more shims are made of a shim material;
   said shim material has a larger coefficient of thermal expansion than that of said cavity material;
   said cavity material is molybdenum, tungsten, glass, ceramic, or silicon;
   said shim material is metal, polymer, phosphor bronze, or liquid;
   stacking said one or more chips on top of each other over said substrate in each of said array of one or more cavities;
   wherein dimensions of each of said array of one or more cavities are slightly larger than dimensions of said stacked chips;
   pushing said stacked chips against one or more of said walls of each of said array of one or more cavities;
   placing said one or more shims in the gaps between said stacked chips and said walls of each of said array of one or more cavities;
   applying pressure vertically to said stacked chips over said substrate;
   laminating by heating up said one or more chips, said one or more shims, said array of one or more cavities, and said substrate;
   bonding said one or more chips to each other and to said substrate at a bonding temperature;
   expanding and deforming said one or more shims at said bonding temperature;
   said deformed one or more shims pushing and aligning said one or more chips to said walls of said array of one or more cavities;
   holding said one or more chips, with one or more molds, wherein said one or more chips in said stacked chips have different sizes; and
   removing said array of one or more cavities by removing cavity material after said lamination.

* * * * *